(12) United States Patent
Zhang

(10) Patent No.: US 11,969,767 B2
(45) Date of Patent: Apr. 30, 2024

(54) WAFER CLEANING DEVICE AND WAFER CLEANING SYSTEM

(71) Applicant: CHANGXIN MEMORY TECHNOLOGIES, INC., Hefei (CN)

(72) Inventor: Feng Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 303 days.

(21) Appl. No.: 17/439,075

(22) PCT Filed: Jun. 8, 2021

(86) PCT No.: PCT/CN2021/098978
§ 371 (c)(1),
(2) Date: Sep. 14, 2021

(87) PCT Pub. No.: WO2022/048226
PCT Pub. Date: Mar. 10, 2022

(65) Prior Publication Data
US 2023/0056698 A1    Feb. 23, 2023

(30) Foreign Application Priority Data

Sep. 2, 2020   (CN) .......................... 202010910675.5

(51) Int. Cl.
*B08B 3/02*       (2006.01)
*B08B 13/00*      (2006.01)
*H01L 21/67*      (2006.01)

(52) U.S. Cl.
CPC ............... *B08B 3/02* (2013.01); *B08B 13/00* (2013.01); *H01L 21/67017* (2013.01); *H01L 21/67051* (2013.01); *H01L 21/67253* (2013.01)

(58) Field of Classification Search
CPC ......... H01L 21/67253; H01L 21/67017; H01L 21/67051; B08B 13/00; B08B 3/02
See application file for complete search history.

(56) References Cited

U.S. PATENT DOCUMENTS

| | | |
|---|---|---|
| 10,558,120 B2 | 2/2020 | Zhou et al. |
| 2006/0070641 A1* | 4/2006 | Kim .......................... B08B 3/12 134/186 |
| 2013/0333722 A1 | 12/2013 | Tanaka |

FOREIGN PATENT DOCUMENTS

| | | | | |
|---|---|---|---|---|
| CA | 3147175 A1 * | 3/2021 | ............... | B03D 1/02 |
| CN | 101295622 A | 10/2008 | | |

(Continued)

OTHER PUBLICATIONS

Machine translation of CN109424557 to Feng et al., Mar. 2019. (Year: 2019).*

(Continued)

*Primary Examiner* — Benjamin L Osterhout
(74) *Attorney, Agent, or Firm* — Cooper Legal Group, LLC

(57) ABSTRACT

The present disclosure relates to the technical field of wafer cleaning, and in particular to a wafer cleaning device and a wafer cleaning system. The wafer cleaning device includes a liquid inlet pipe, a first liquid discharge pipe, a first valve and a liquid supply device, wherein the liquid inlet pipe has an inlet terminal and an outlet terminal; a wall of the liquid inlet pipe is protruded outward to form a protrusion, the protrusion having a cavity; one terminal of the first liquid discharge pipe is communicated with the cavity, while the other terminal thereof is communicated with a container; the first valve is arranged on the liquid inlet pipe and located between the protrusion and the outlet terminal; and, the (Continued)

liquid supply device is communicated with the inlet terminal of the liquid inlet pipe to import cleaning solution into the liquid inlet pipe.

12 Claims, 4 Drawing Sheets

(56)  References Cited

FOREIGN PATENT DOCUMENTS

| | | | |
|---|---|---|---|
| CN | 101301644 | A | 11/2008 |
| CN | 201783231 | U * | 4/2011 |
| CN | 104916565 | A | 9/2015 |
| CN | 104225964 | B | 9/2016 |
| CN | 109424557 | A | 3/2019 |
| JP | 2003136405 | A * | 5/2003 |
| JP | 3607828 | B2 * | 1/2005 |

OTHER PUBLICATIONS

Machine translation of JP 3607828 to Kageyama, Jan. 2005. (Year: 2005).*
Machine translation of JP 2003136405 to Matsumoto, May 2003. (Year: 2003).*
Machine translation of CN 201783231 to Zhong, Apr. 2011. (Year: 2011).*
International Search Report cited in PCT/CN2021/098978 mailed Sep. 7, 2021, 8 pages.

* cited by examiner

WAFER CLEANING DEVICE AND WAFER CLEANING SYSTEM

CROSS-REFERENCE TO RELATED APPLICATIONS

The present disclosure claims the priority to Chinese Patent Application No. 202010910675.5, titled "WAFER CLEANING DEVICE AND WAFER CLEANING SYSTEM", filed on Sep. 2, 2020, which is incorporated herein by reference in its entirety.

TECHNICAL FIELD

The present disclosure relates to the technical field of wafer cleaning, and in particular to a wafer cleaning device and a wafer cleaning system.

BACKGROUND

With the rapid development of society, semiconductor devices are applied more and more widely, and the demand of wafers for manufacturing semiconductor devices is also increasing in a blowout manner. In the wafer machining process, it is inevitable for contaminants such as organic matters, particles and oxides to adhere to the surfaces of wafers. In order to ensure the quality of wafers, it is necessary to spray a cleaning solution onto the wafers by a cleaning device so as to clean the contaminants on the wafers.

At present, the wafer cleaning device has long downtime, so that the normal operation time is short and the utilization of the wafer cleaning device is low.

It is to be noted that the information disclosed in the background section is only provided to enhance the understanding of the background of the present disclosure, and therefore may include information that does not constitute the existing technologies known to a person of ordinary skill in the art.

SUMMARY

According to one aspect of the present disclosure, a wafer cleaning device is provided, comprising:
  a liquid inlet pipe having an inlet terminal and an outlet terminal, the outlet terminal being arranged facing a wafer to be cleaned, a wall of the liquid inlet pipe being protruded outward to form a protrusion, the protrusion having a cavity communicated with inside of the liquid inlet pipe;
  a first liquid discharge pipe, one terminal of the first liquid discharge pipe being communicated with the cavity and the other terminal of the first liquid discharge pipe being communicated with a container;
  a first valve, arranged on the liquid inlet pipe and located between the protrusion and the outlet terminal; and
  a liquid supply device, communicated with the inlet terminal to import cleaning solution into the liquid inlet pipe.

According to another aspect of the present disclosure, a wafer cleaning system is provided, comprising:
  a bearing platform, configured to bear a wafer; and
  any one of the wafer cleaning devices described above, wherein the outlet terminal is arranged facing the bearing platform.

It should be understood that the above general description and following detailed description are merely exemplary and explanatory, and cannot limit the present disclosure.

BRIEF DESCRIPTION OF THE DRAWINGS

The drawings herein are incorporated into the specification and constitute a part of the specification. The drawings show embodiments in accordance with the present disclosure, and are used with the specification to explain the principle of the present disclosure. Apparently, the drawings to be described below are merely some embodiments of the present disclosure, and a person of ordinary skill in the art may further obtain other drawings according to these drawings without paying any creative effort.

Figure 1:
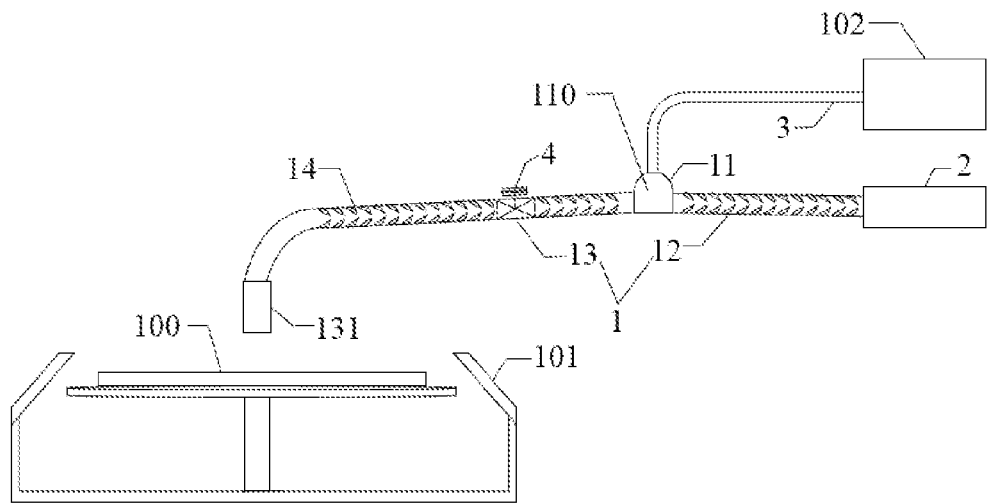
FIG. 1 is a schematic structure diagram of the wafer cleaning device according to an implementation of the present disclosure.

In the drawings: 100: wafer; 101: bearing platform; 102: container; 1: liquid inlet pipe; 11: protrusion; 110: cavity; 12: first section; 13: second section; 131: nozzle; 14: bubble thorn; 2: liquid supply device; 3: first liquid discharge pipe; 4: first valve; 5: second liquid discharge pipe; 6: second valve; 7: photoelectric sensing device; 71: light emitting end; 72: light receiving end; 8: controller; 9: flow meter; 10: third valve; and, 15: fourth valve.

DETAILED DESCRIPTION

Exemplary implementations will now be described more fully with reference to the drawings. However, the exemplary implementations may be implemented in various forms, and should not be construed as being limited to the implementations set forth herein; instead, these implementations are provided to make the present disclosure more comprehensive and complete, and to fully convey the conceptions of the exemplary implementations to those skilled in the art. The same reference numerals in the drawings denote the same or similar structures, and thus the detailed description thereof will be omitted. In addition, the drawings are merely schematic illustrations of the present disclosure, and are not necessarily drawn to scale.

The described features, structures or characteristics may be combined in one or more embodiments in any suitable way. In the following description, many specific details are provided to give a sufficient understanding of the embodiments of the present disclosure. However, it will be recognized by those skilled in the art that the technical solutions of the present disclosure may be practiced without one or more of the specific details, or other methods, components, materials, etc. may be used. In other instances, well-known structures, materials or operations are not shown or described in detail to avoid obscuring the main technical idea of the present disclosure.

Although relative terms such as "upper" and "lower" are used in this specification to describe the relative relationship between one component and another component, these terms are used in this specification just for convenience, for example, in the exemplary direction as shown in the drawings. It should be understood that, if the device as shown is turned upside down, the component described as "upper" will become the "lower" component. Other relative terms such as "high", "low", "top", "bottom", "left" and "right" also have similar meanings.

When a structure is "on" other structures, it may mean that the structure is integrally formed on the other structures, or that the structure is "directly" arranged on the other structures, or that the structure is "indirectly" arranged on the other structures by another structure. The words "a", "an" and "the" are used to indicate the presence of one or more elements/components/the like. The words "comprise" and "have" are used to indicate an open inclusion, and mean that there may be other elements/components/the like in addition to the listed elements/components/the like. The terms such as "first" and "second" are only used as markers and not intended to limit the number of objects.

In the related art, since the wafer cleaning solution is generally a mixed solution composed of normal-temperature $CO_2$ water, hot plasma water and APM solution (including $NH_4OH$ and $H_2O_2$), the $CO_2$ water produces $CO_2$ bubbles since the gas solubility of the $CO_2$ water is reduced after being heated, and the bubbles will lead to an unstable flow of the cleaning solution, so that the etching rate of the wafer is unstable. Meanwhile, bubble aggregation will produce bubbles in a large size, and the bubbles in a large size will result in abnormal operation of valves in the wafer cleaning device, so that the cleaning solution cannot be sprayed out normally, resulting in defective wafers. Therefore, when too many bubbles adhere onto the pipe, the wafer cleaning device will stop and give an alarm to remind an operator to discharge bubbles in the pipe.

At present, bubbles are discharged manually. Specifically, the valve on the pipe is opened to the greatest extent, and bubbles in the pipe are washed away by the cleaning solution at the maximum flow. At this time, the machining equipment for wafers stops operating, and the machining equipment needs to be restarted at the end of the bubble discharge process. However, it takes a long time to restart the machining equipment, and the wafer cleaning device is halted, so that the normal operation time of the wafer cleaning device is short and the utilization of the wafer cleaning device is low.

In order to solve the above problem, an implementation of the present disclosure provides a wafer cleaning device configured to clean a wafer 100. As shown in FIG. 1, the wafer 100 may be arranged on a bearing platform 101, and the bearing platform 101 is configured to bear the wafer 100. Of course, the bearing platform 101 can also collect and discharge the cleaning solution sprayed on the wafer, and the detailed description thereof will not be repeated.

As shown in FIG. 1, the wafer cleaning device may comprise a liquid inlet pipe 1, a liquid supply device 2, a first liquid discharge pipe 3 and a first valve 4, wherein:

The liquid inlet pipe 1 may have an inlet terminal and an outlet terminal, and the inlet terminal may be communicated with the liquid supply device 2. The liquid supply device 2 is configured to import cleaning solution into the liquid inlet pipe 1. The outlet terminal may be arranged facing the wafer 100 to be cleaned. A wall of the liquid inlet pipe 1 may be protruded outward to form a protrusion 11. The protrusion 11 may have a cavity 110 communicated with inside of the liquid inlet pipe 1. One terminal of the first liquid discharge pipe 3 may be communicated with the cavity 110, while the other terminal thereof may be communicated with a container 102 that is configured to collect the cleaning solution. The container 102 may be a component of the wafer cleaning device. Of course, the container 102 may also be a drainage pit on the ground, and will not be specially limited here. The first valve 4 may be arranged on the liquid inlet pipe 1, and the first valve 4 may be located between the protrusion 11 and the outlet terminal of the liquid inlet pipe 1.

For the wafer cleaning device according to the present application, the cleaning solution can be discharged into the container 102 through the first liquid discharge pipe 3 so as to take away bubbles in the liquid inlet pipe 1. Therefore, the wafer cleaning device according to the implementation of the present disclosure can shorten downtime, so that the normal operation time of the wafer cleaning device is prolonged and the utilization of the wafer cleaning device is improved.

The components of the wafer cleaning device according to the implementations of the present disclosure will be described below in detail with reference to the drawings.

As shown in FIG. 1, the wall of the liquid inlet pipe 1 may be protruded outward to form a protrusion 11. The protrusion 11 may be cylindrical, hemispherical, etc., which will not be listed here. Meanwhile, the protrusion 11 may have a cavity 110 communicated with inside of the liquid inlet pipe 1. The cavity 110 is configured to collect and gather bubbles in the cleaning solution, so an inner surface of the cavity 110 may be a smooth curved surface, so that it is advantageous for the flow direction and gathering of the bubbles.

The liquid inlet pipe 1 may comprise a first section 12 and a second section 13, wherein the first section 12 may have the inlet terminal, the second section 13 may have the outlet terminal, and a nozzle 131 may be arranged at the outlet terminal. The cleaning solution forms a powerful jet flow and rushes to the wafer 100 after flowing through the nozzle 131.

For example, the nozzle 131 may be made of a corrosion-resistant hard material, for example, hard alloy or ceramic, and the nozzle 131 may be conical, hyperboloidal, isovariable, etc., which will not be listed here.

Meanwhile, the first section 12 and the second section 13 may be arranged at an included angle in back of the protrusion 11. That is, the protrusion 11 may be located at a connection of the first section 12 and the second section 13. At this time, the first section 12, the second section 13 and the protrusion 11 are formed integrally, so that the airtightness of the liquid inlet pipe 1 and the whole wafer cleaning device is improved.

Of course, the first section 12, the second section 13 and the protrusion 11 in the liquid inlet pipe 1 may also be separate parts. That is, the first section 12 and the second section 13 may be two separate pipes, the protrusion 11 may be a separate collection container, and the two separate pipes may be connected to two sides of the wafer cleaning device at an included angle by welding, bonding, etc.

For example, the included angle between the first section 12 and the second section 13 may be an acute angle. Of course, the included angle may also be an obtuse angle less than 180°, and will not be specially limited here.

It is to be noted that, during the arrangement and mounting of the wafer cleaning device, the protrusion 11 of the liquid inlet pipe 1 should be arranged facing upward, and the cavity 110 is located at the highest position of the first section 12 in the presence of the included angle. Of course, the cavity 110 is also located at the highest position of the second section 13. Thus, bubbles in the cleaning solution in the first section 12 and the second section 13 can automatically float upward into the cavity 110 due to buoyancy, so that the flow of the cleaning solution sprayed onto the wafer 100 is stable and the stability of the etching rate of the wafer 100 is improved.

As described above, bubbles in a large size will lead abnormal operation of valves, so that the cleaning solution cannot be sprayed out normally, resulting in defective wafers 100. As shown in FIG. 1, bubble thorns 14 may be arranged on an inner wall of the liquid inlet pipe 1. The bubble thorns 14 can puncture bubbles in the liquid inlet pipe 1, so that the bubbles in a large size are decomposed into bubbles in a small size. That is, the wafer cleaning device according to the implementation of the present disclosure can reduce the production of large bubbles, so that the machining yield of the wafer 100 is improved and the occurrence of device alarm is reduced.

The bubble thorns 14 may be conical. For example, the cone may be a circular cone or a pyramid, and will not be specially limited here. Meanwhile, the bottom surfaces of the bubble thorns 14 may be arranged on the inner wall of the liquid inlet pipe 1. That is, the bottom surfaces of the circular cones or pyramids may be connected to the inner wall of the liquid inlet pipe 1 by adhering, riveting, etc., and the detailed description thereof will not be repeated here.

Of course, the tops of the bubble thorns 14 are inclined toward the inlet terminal of the liquid inlet pipe 1. That is, the bubble thorns 14 are barbs, so that the cleaning solution can come into contact with the bubble thorns 14 in the flowing process, and the bubbles in a large size are decomposed into bubbles in a small size.

For example, the value of the included angle between the top of each bubble thorn 14 and the inner wall of the liquid inlet pipe 1 may range from 20° to 60°. Of course, the value of the included angle may also be other values as long as the bubbles in the cleaning solution can be punctured. This will not be specially limited here.

There may be a plurality of bubble thorns 14, and the plurality of bubble thorns 14 may be divided into a plurality of bubble thorn groups. Each bubble thorn group may comprise a plurality of bubble thorns 14 distributed in a circumferential direction of the liquid inlet pipe 1, and the plurality of bubble thorn groups may be distributed in an axial direction of the liquid inlet pipe 1, so that a better puncturing effect is achieved.

It is to be noted that, after the bubble thorns 14 decompose the bubbles in a large size into bubbles in a small size, the included angle space formed by the bubble thorns 14 and the inner wall of the liquid inlet pipe 1 blocks the bubbles to a certain extent, so that the amount of bubbles in the cleaning solution sprayed onto the wafer 100 is decreased, and the etching stability of the wafer 100 is improved.

Therefore, the wafer cleaning device according to the implementation of the present disclosure can puncture bubbles in a large size in the process of the bubbles floating upward to the cavity 110, so that the flow of the cleaning solution and the etching rate of the wafer are relatively stable, and the yield of the wafer is improved.

As shown in FIG. 1, the liquid supply device 2 is communicated with the inlet terminal of the liquid inlet pipe 1 to import the cleaning solution into the liquid inlet pipe 1. For example, the liquid supply device 2 may be a liquid supply pipe or a liquid supply tank. Of course, the liquid supply device 2 may further comprise a water suction pump that is communicated with the liquid supply pipe or the liquid supply tank to increase the pressure in the liquid supply pipe or the liquid supply tank, and the detailed description thereof will not be repeated here.

As shown in FIG. 1, one terminal of the first liquid discharge pipe 3 may be communicated with the cavity 110, while the other terminal thereof may be communicated with a container 102, and the diameter of the first liquid discharge pipe 3 may be less than the diameter of the liquid inlet pipe 1, so that it is convenient to discharge the cleaning solution in the liquid inlet pipe 1.

For example, the container 102 may be a drainage tank or a drainage pipe, and will not be specially limited here. Of course, the container 102 may be communicated with a facility gravity drainage, and the cleaning solution is treated by the facility and then discharged to avoid polluting the environment.

It is to be noted that one terminal of the first liquid discharge pipe 3 may be communicated with the top of the cavity 110, that is, the first liquid discharge pipe 3 is arranged higher than the liquid inlet pipe 1, so that it is convenient to discharge the bubbles collected in the cavity 110 into the first liquid discharge pipe 3, and the bubble discharge effect of the wafer cleaning device is improved.

As shown in FIG. 1, the first valve 4 may be arranged on the liquid inlet pipe 1, and the first valve 4 may be located between the protrusion 11 and the outlet terminal of the liquid inlet pipe 1 to adjust the flow of the cleaning solution sprayed onto the wafer 100. Furthermore, the first valve 4 may be arranged close to the protrusion 11. Thus, after the first valve 4 is closed, the cleaning solution in the liquid inlet pipe 1 can be all discharged to the container 102 through the first liquid discharge pipe 3, so that the bubble discharge effect is improved.

Figure 2:
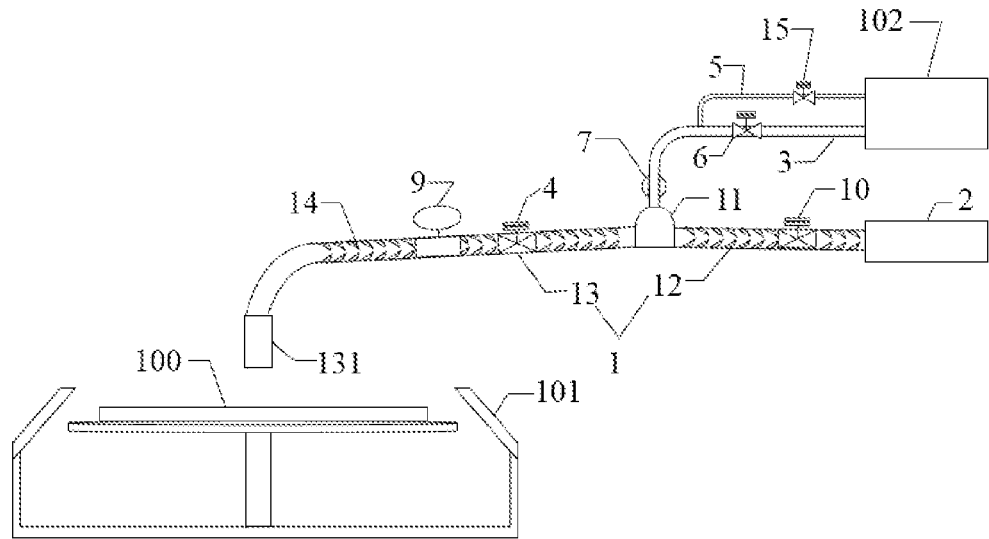
FIG. 2 is another schematic structure diagram of the wafer cleaning device according to an implementation of the present disclosure.

As shown in FIG. 2, the wafer cleaning device according to the implementation of the present disclosure may further comprise a second liquid discharge pipe 5, one terminal of the second liquid discharge pipe 5 may be communicated with the liquid inlet pipe 1 and the other terminal of the second liquid discharge pipe 5 may be communicated with the container 102, and the diameter of the second liquid discharge pipe 5 is less than the diameter of the liquid inlet pipe 1, so that it is convenient to discharge the cleaning solution from the second liquid discharge pipe 5. Of course, the second liquid discharge pipe 5 may also be communicated with the first liquid discharge pipe 3. At this time, the second liquid discharge pipe 5 is communicated with the liquid inlet pipe 1 by the first liquid discharge pipe 3.

In addition, the wafer cleaning device according to the implementation of the present disclosure may further comprise a second valve 6, a photoelectric sensing device 7 and a controller 8, wherein:

The second valve 6 may be arranged on the first liquid discharge pipe 3 and located between a connection and the container 102, and the connection is a connection of the first liquid discharge pipe 3 and the second liquid discharge pipe 5. As described above, the diameter of the second liquid discharge pipe 5 is less than the diameter of the liquid inlet pipe 1, and the diameter of the first liquid discharge pipe 3 is less than the diameter of the liquid inlet pipe 1. Furthermore, the diameter of the second liquid discharge pipe 5 may be less than the diameter of the first liquid discharge pipe 3.

For example, the diameter of the first liquid discharge pipe 3 may be 70% to 80% of the diameter of the liquid inlet pipe 1, and the diameter of the second liquid discharge pipe 5 may be 20% to 30% of the diameter of the liquid inlet pipe 1. The detailed description thereof will not be repeated here.

The photoelectric sensing device 7 may be arranged in a preset region of the first liquid discharge pipe 3 to detect the luminous flux of the preset region. It is to be noted that the detection of the luminous flux can be realized when the first liquid discharge pipe 3 is a transparent pipe.

As described above, the bubbles gathered in the cavity 110 will move to a position of the first liquid discharge pipe 3 close to the cavity 110 due to buoyancy and the cleaning solution, so the preset region may be arranged close to the cavity 110. Of course, the preset region is also located at any position between the connection of the first liquid discharge pipe 3 and the second liquid discharge pipe 5 and the container 102, and this will not be specially limited here.

Figure 3:
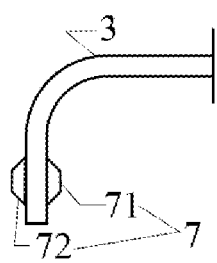
FIG. 3 is a schematic structure diagram of the photoelectric sensing device according to an implementation of the present disclosure.

Specifically, as shown in FIG. 3, the photoelectric sensing device 7 may comprise a light emitting end 71 and a light receiving end 72, wherein the light emitting end 71 may be arranged in the preset region to emit light rays to the first liquid discharge pipe 3; and, the light receiving end 72 is arranged directly facing the light emitting end 71 to receive light rays from the light emitting end 71.

It should be easily understood that, when there are many bubbles in the first liquid discharge pipe 3, the luminous flux of the preset region is relatively small; and, when there are few bubbles in the first liquid discharge pipe 3, the luminous flux of the preset region is relatively large. The specific correspondence will not be described in detail here.

Figure 4:
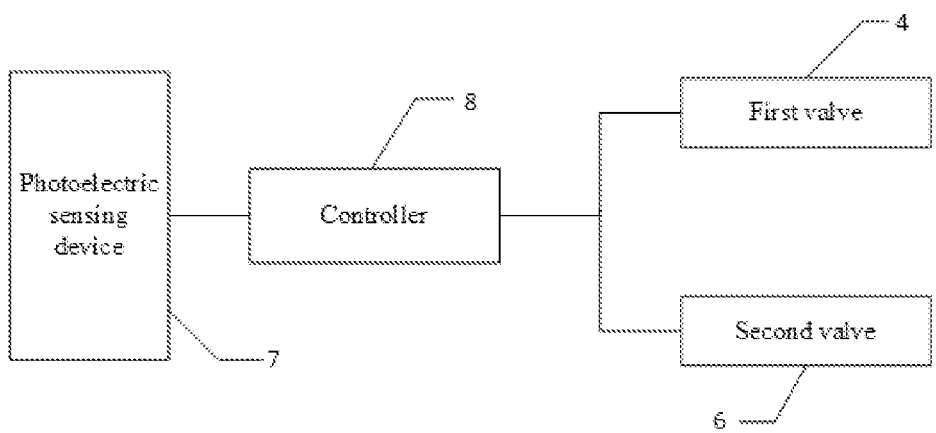
FIG. 4 is a schematic connection diagram of the controller, the photoelectric sensing device, the first valve and the second valve according to an implementation of the present disclosure.

As shown in FIG. 4, the controller 8 may be connected to the photoelectric sensing device 7 in a wired or wireless manner. This will not be specially limited here. Of course, the controller 8 may also be connected to the first valve 4 and the second valve 6 to control the opening and closing of the first valve 4 and the second valve 6. At this time, both the first valve 4 and the second valve 6 are solenoid valves.

Figure 5:
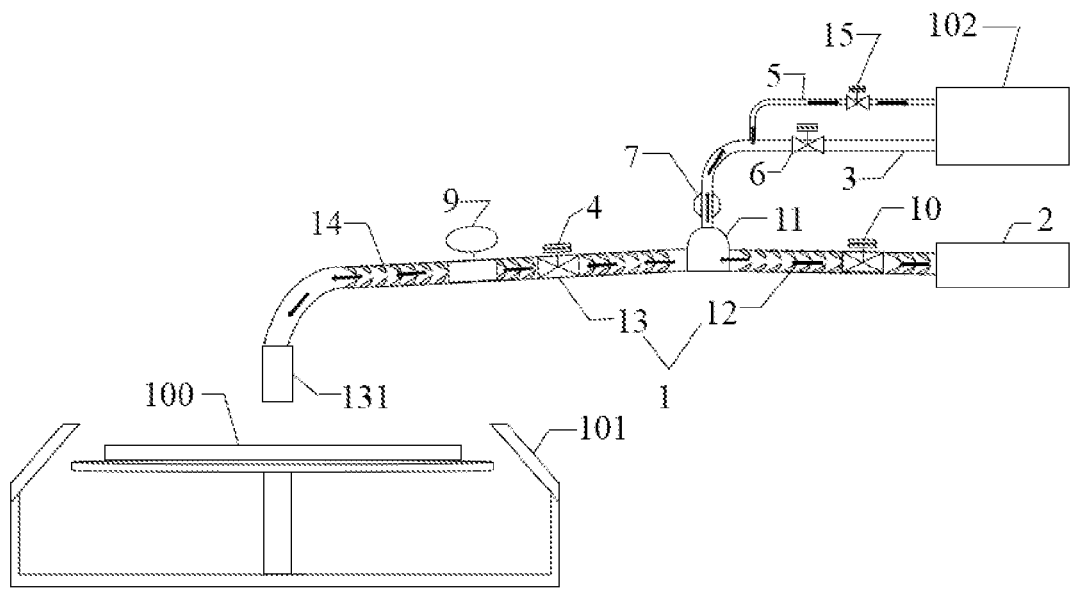
FIG. 5 is a schematic diagram of the flow direction of the cleaning solution when the wafer cleaning device is in an operating state.

Therefore, when the luminous flux of the preset region is less than a preset value (it is equivalent that the amount of bubbles in the first liquid discharge pipe 3 is less than a preset value), the controller 8 controls the first valve 4 to open and the second valve 6 to close. At this time, as shown in FIG. 5, the cleaning solution is sprayed onto the wafer 100 through the outlet terminal of the liquid inlet pipe 1 and then discharged into the container 102 through the second liquid discharge pipe 5, so that bubbles are driven to move to the first liquid discharge pipe 3, and the cleaning solution in the first liquid discharge pipe 3 is kept in a flowing water state. That is, the wafer cleaning device according to the implementation of the present disclosure is in an operating state.

Figure 6:
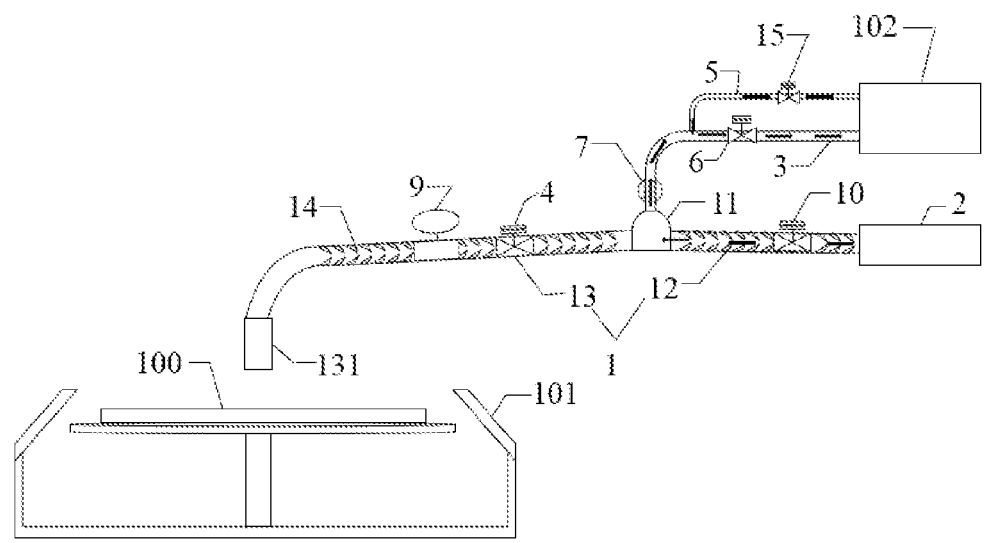
FIG. 6 is a schematic diagram of the flow direction of the cleaning solution when the wafer cleaning device is in a bubble discharge state.

Also, when the luminous flux of the preset region is greater than the preset value (it is equivalent that the amount of bubbles in the first liquid discharge pipe 3 is greater than a preset value), the controller 8 can control the first valve 4 to close and the second valve 6 to open. At this time, as shown in FIG. 6, the cleaning solution is discharged into the container 102 through the first liquid discharge pipe 3 and the second liquid discharge pipe 5, so that the speed of discharging bubbles is quickened. That is, the wafer cleaning device according to the implementation of the present disclosure is in a bubble discharge state.

For example, the preset value of the luminous flux may be 800 lumen to 1000 lumen. Of course, the preset value of the luminous flux may also be other values, and this will not be specially limited here.

Figure 7:
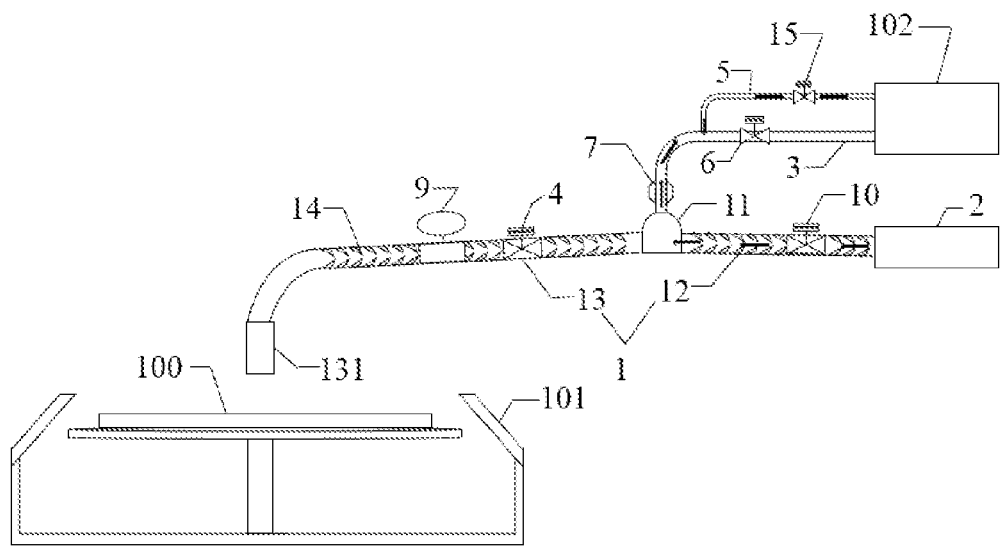
FIG. 7 is a schematic diagram of the flow direction of the cleaning solution when the wafer cleaning device is in an idle state.

It is to be noted that, when the first valve 4 is closed and the second valve 6 is opened, as shown in FIG. 7, the cleaning solution is discharged through only the second liquid discharge pipe 5. However, since the diameter of the second liquid discharge pipe 5 is far less than the diameter of the liquid inlet pipe 1, a small amount of the cleaning solution is discharged. At this time, the wafer cleaning device according to the implementation of the present disclosure is in an idle state.

As shown in FIG. 2, the wafer cleaning device according to the implementation of the present disclosure may further comprise a flow meter 9, a third valve 10 and a fourth valve 15, wherein:

The flow meter 9 may be arranged on the liquid inlet pipe 1 and located between the first valve 4 and the outlet terminal of the liquid inlet pipe 1 to detect the flow of the cleaning solution sprayed onto the wafer 100. The specification of the flow meter 9 will not be specially limited here.

The third valve 10 may be arranged on the liquid inlet pipe 1 and located between the inlet terminal of the liquid inlet pipe 1 and the protrusion 11 to control the start or end of the cleaning process. Of course, the third valve 10 may also control the flow of the cleaning solution entering the liquid inlet pipe 1, and the detailed description thereof will not be repeated here.

The fourth valve 15 may be arranged on the second liquid discharge pipe 5 and located between the connection of the first liquid discharge pipe 3 and the second liquid discharge pipe and the container 102 to adjust the flow of the cleaning solution flowing through the second liquid discharge pipe 5.

Therefore, in the process of installing and debugging the wafer cleaning device, the flow of the cleaning solution discharged through the second liquid discharge pipe 5 when the wafer cleaning device is in an idle state can be controlled manually by the fourth valve 15. At this time, the fourth valve 15 is an ordinary manually-operated valve.

Figure 8:
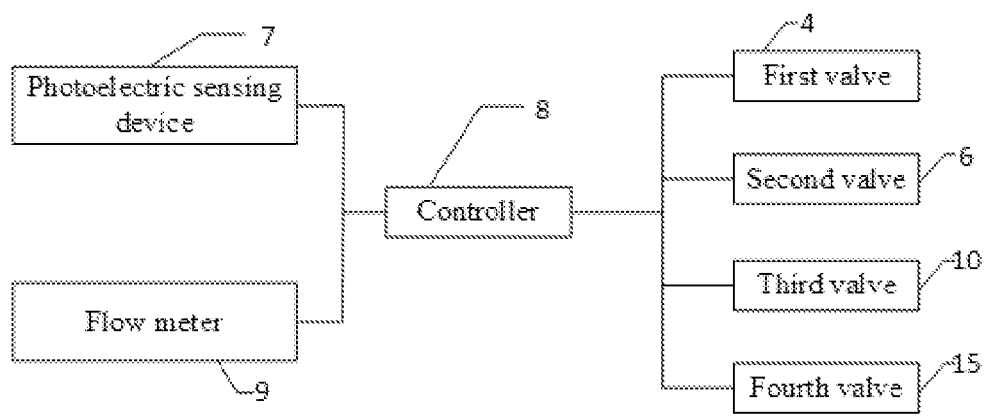
FIG. 8 is a schematic connection diagram of the controller, the flow meter, the photoelectric sensing device, the first valve, the second valve, the third valve and the fourth valve according to an implementation of the present disclosure.

Of course, the fourth valve 15 may also be controlled automatically. As shown in FIG. 8, the flow meter 9, the third valve 10 and the fourth valve 15 may be connected to the controller 8. At this time, both the third valve 10 and the fourth valve 15 are solenoid valves. Thus, the controller 8 can realize the automatic monitoring of the flow of the cleaning solution and the automatic operation of the whole wafer cleaning device, and the detailed description thereof will not be repeated here.

An implementation of the present disclosure further provides a wafer cleaning system. The wafer cleaning system may comprise a bearing platform and any one of the wafer cleaning devices described above, wherein the bearing platform is configured to bear a wafer, and the outlet terminal of the liquid inlet pipe in the wafer cleaning device is arranged facing the bearing platform. Of course, the bearing platform can also collect and discharge the cleaning solution sprayed onto the wafer, and the detailed description thereof will not be repeated here.

Those skilled in the art will readily think of other implementations of the present disclosure by considering the specification and practicing the invention disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

The invention claimed is:

1. A wafer cleaning device, comprising:
a liquid inlet pipe having an inlet terminal and an outlet terminal, the outlet terminal being arranged facing a wafer to be cleaned, a wall of the liquid inlet pipe being protruded outward to form a protrusion, the protrusion having a cavity in communication with an inside of the liquid inlet pipe, bubble thorns being arranged on an inner wall of the liquid inlet pipe, a shape of the bubble thorns being a cone, and bottom surfaces of the bubble thorns being arranged on the inner wall of the liquid inlet pipe;
a first liquid discharge pipe, one terminal of the first liquid discharge pipe being in communication with the cavity and a second terminal of the first liquid discharge pipe being in communication with a container;
a first valve, arranged on the liquid inlet pipe and located between the protrusion and the outlet terminal; and
a liquid supply device, in communication with the inlet terminal to import cleaning solution into the liquid inlet pipe.

2. The wafer cleaning device of claim 1, wherein the liquid inlet pipe comprises a first section and a second section; the protrusion is located at a connection of the first section and the second section; and the first section and the second section are arranged at an included angle in back of the protrusion.

3. The wafer cleaning device of claim 1, wherein tops of the bubble thorns are inclined toward the inlet terminal.

4. The wafer cleaning device of claim 1, wherein the bubble thorns are divided into a plurality of bubble thorn groups, each of the plurality of bubble thorn groups comprises a plurality of the bubble thorns distributed in a circumferential direction of the liquid inlet pipe, and the plurality of bubble thorn groups are distributed in an axial direction of the liquid inlet pipe.

5. The wafer cleaning device of claim 1, wherein an inner surface of the cavity is a smooth curved surface.

6. The wafer cleaning device of claim 1, further comprising:
a second liquid discharge pipe, one terminal of the second liquid discharge pipe being in communication with the liquid inlet pipe and a second terminal of the second liquid discharge pipe being in communication with the container, a diameter of the second liquid discharge pipe being less than a diameter of the liquid inlet pipe.

7. The wafer cleaning device of claim 6, wherein the second liquid discharge pipe is in communication with the first liquid discharge pipe, and the second liquid discharge pipe is in communication with the liquid inlet pipe by the first liquid discharge pipe.

8. The wafer cleaning device of claim 6, wherein the diameter of the second liquid discharge pipe is less than a diameter of the first liquid discharge pipe, and the diameter of the first liquid discharge pipe is less than the diameter of the liquid inlet pipe.

9. The wafer cleaning device of claim 8, further comprising:
a second valve, arranged on the first liquid discharge pipe and located between a connection and the container, the connection being a connection of the second liquid discharge pipe and the first liquid discharge pipe;
a photoelectric sensing device, arranged in a preset region of the first liquid discharge pipe, the first liquid discharge pipe being a transparent pipe, the photoelectric sensing device being configured to detect luminous flux of the preset region; and
a controller, configured to control the first valve to close and the second valve to open when the luminous flux is less than a preset value, and control the first valve to open and the second valve to close when the luminous flux is greater than the preset value.

10. The wafer cleaning device of claim 9, further comprising:
a third valve, arranged on the liquid inlet pipe and located between the protrusion and the inlet terminal.

11. A wafer cleaning system, comprising:
a bearing platform, configured to bear a wafer; and
a wafer cleaning device;
wherein the wafer cleaning device comprises a liquid inlet pipe, a first liquid discharge pipe, a first valve and a liquid supply device; the liquid inlet pipe has an inlet terminal and an outlet terminal, the outlet terminal is arranged facing a wafer to be cleaned, a wall of the liquid inlet pipe is protruded outward to form a protrusion, the protrusion has a cavity in communication with an inside of the liquid inlet pipe, bubble thorns are arranged on an inner wall of the liquid inlet pipe, a shape of the bubble thorns is a cone, and bottom surfaces of the bubble thorns are arranged on the inner wall of the liquid inlet pipe; one terminal of the first liquid discharge pipe is in communication with the cavity and a second the other terminal of the first liquid discharge pipe is in communication with a container; the first valve is arranged on the liquid inlet pipe and located between the protrusion and the outlet terminal; the liquid supply device is in communication with the inlet terminal to import cleaning solution into the liquid inlet pipe; and
the outlet terminal is arranged facing the bearing platform.

12. A wafer cleaning device, comprising:
a liquid inlet pipe having an inlet terminal and an outlet terminal, the outlet terminal being arranged facing a wafer to be cleaned, a wall of the liquid inlet pipe being protruded outward to form a protrusion, the protrusion having a cavity in communication with an inside of the liquid inlet pipe;
a first liquid discharge pipe, one terminal of the first liquid discharge pipe being in communication with the cavity and a second terminal of the first liquid discharge pipe being in communication with a container;
a first valve, arranged on the liquid inlet pipe and located between the protrusion and the outlet terminal;
a liquid supply device, in communication with the inlet terminal to import cleaning solution into the liquid inlet pipe;
a second liquid discharge pipe, one terminal of the second liquid discharge pipe being in communication with the liquid inlet pipe and a second terminal of the second liquid discharge pipe being in communication with the container, a diameter of the second liquid discharge pipe being less than a diameter of the liquid inlet pipe, wherein the diameter of the second liquid discharge pipe is less than a diameter of the first liquid discharge pipe, and the diameter of the first liquid discharge pipe is less than the diameter of the liquid inlet pipe;
a second valve, arranged on the first liquid discharge pipe and located between a connection and the container, the connection being a connection of the second liquid discharge pipe and the first liquid discharge pipe;

a photoelectric sensing device, arranged in a preset region of the first liquid discharge pipe, the first liquid discharge pipe being a transparent pipe, the photoelectric sensing device being configured to detect luminous flux of the preset region; and a controller, configured to control the first valve to close and the second valve to open when the luminous flux is less than a preset value, and control the first valve to open and the second valve to close when the luminous flux is greater than the preset value.

\* \* \* \* \*